United States Patent
Campbell et al.

(10) Patent No.: US 7,405,936 B1
(45) Date of Patent: *Jul. 29, 2008

(54) HYBRID COOLING SYSTEM FOR A MULTI-COMPONENT ELECTRONICS SYSTEM

(75) Inventors: Levi A. Campbell, Poughkeepsie, NY (US); Richard C. Chu, Hopewell Junction, NY (US); Michael J. Ellsworth, Jr., Lagrangeville, NY (US); Madhusudan K. Iyengar, Woodstock, NY (US); Roger R. Schmidt, Poughkeepsie, NY (US); Robert E. Simons, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/055,455

(22) Filed: Mar. 26, 2008

Related U.S. Application Data

(63) Continuation of application No. 11/539,902, filed on Oct. 10, 2006.

(51) Int. Cl.
*H05K 7/20* (2006.01)
*F28F 7/00* (2006.01)

(52) U.S. Cl. ............... 361/699; 165/80.2; 361/702

(58) Field of Classification Search .......... 361/702
See application file for complete search history.

(56) References Cited

U.S. PATENT DOCUMENTS

| | | | |
|---|---|---|---|
| 4,771,366 A | 9/1988 | Blake et al. | |
| 4,884,168 A | 11/1989 | August et al. | |
| 5,285,347 A * | 2/1994 | Fox et al. | ............ 361/699 |
| 5,323,847 A | 6/1994 | Koizumi et al. | |
| 5,801,924 A | 9/1998 | Salmonson | |
| 6,437,980 B1 | 8/2002 | Casebolt | |
| 6,967,841 B1 | 11/2005 | Chu et al. | |
| 6,967,842 B2 | 11/2005 | Aoki et al. | |
| 6,970,355 B2 | 11/2005 | Ellsworth et al. | |
| 7,011,143 B2 | 3/2006 | Corrado et al. | |
| 7,012,807 B2 | 3/2006 | Chu et al. | |
| 7,203,063 B2 | 4/2007 | Bash et al. | |
| 2005/0068728 A1 | 3/2005 | Chu et al. | |
| 2007/0035937 A1 | 2/2007 | Colbert et al. | |
| 2008/0024991 A1 | 1/2008 | Colbert et al. | |

* cited by examiner

*Primary Examiner*—Gregory D Thompson
(74) *Attorney, Agent, or Firm*—Lily Neff, Esq.; Kevin P. Radigan, Esq.; Heslin Rothenberg Farley & Mesiti P.C.

(57) ABSTRACT

A hybrid cooling system and method of fabrication are provided for a multi-component electronics system. The cooling system includes an air moving device for establishing air flow across at least one primary and at least one secondary heat generating component to be cooled; and a liquid-based cooling subsystem including at least one cold plate, physically coupled to the at least one primary heat generating component, and a thermally conductive coolant-carrying tube in fluid communication with the at least one cold plate. A thermally conductive auxiliary structure is coupled to the coolant-carrying tube and includes a plurality of thermally conductive fins extending from a surface thereof. The plurality of thermally conductive fins are disposed at least partially over the at least one secondary heat generating component to be cooled, and provide supplemental cooling of at least a portion of the air flow established across the multiple components of the electronics system.

19 Claims, 7 Drawing Sheets

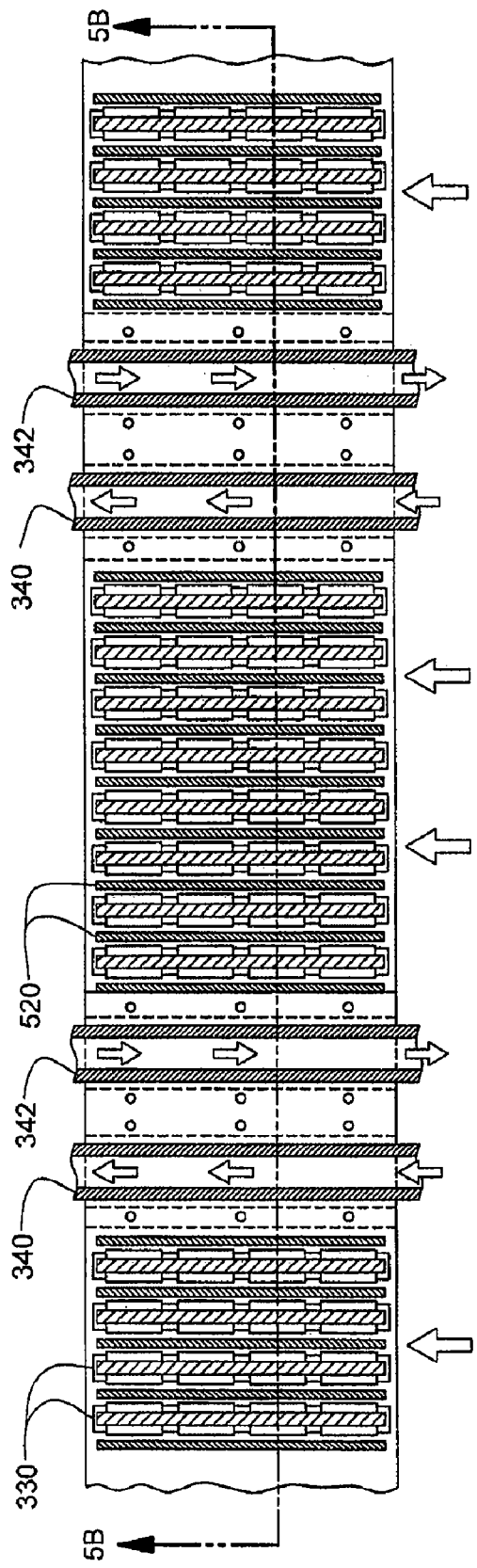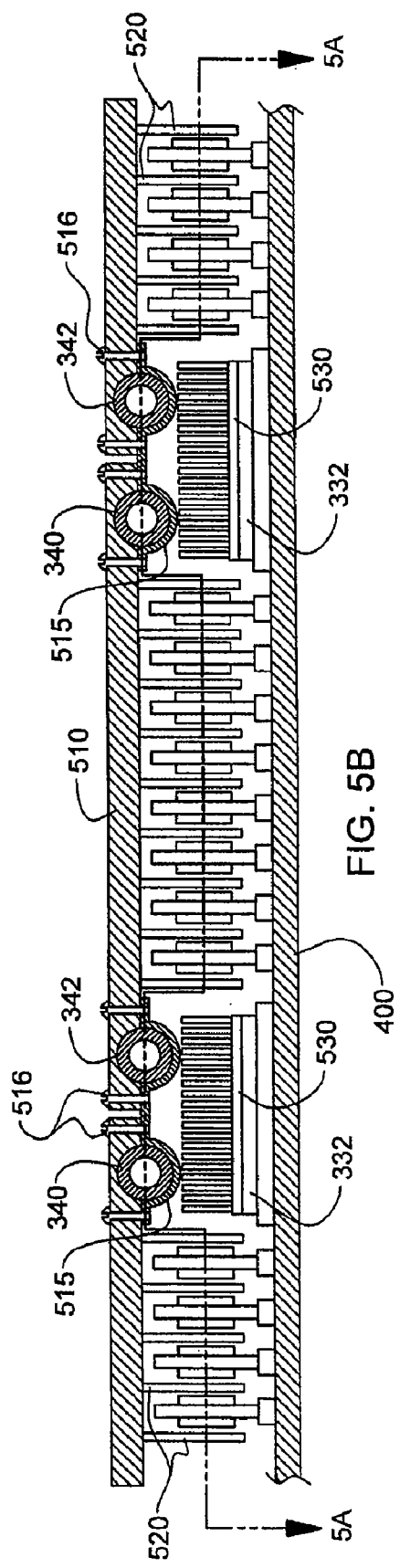
FIG. 5A
FIG. 5B

HYBRID COOLING SYSTEM FOR A MULTI-COMPONENT ELECTRONICS SYSTEM

CROSS-REFERENCE TO RELATED APPLICATIONS

This application is a continuation of co-pending U.S. patent application Ser. No. 11/539,902, filed Oct. 10, 2006, entitled "Hybrid Cooling System and Method for a Multi-Component Electronics System", by Campbell et al., the entirety of which is hereby incorporated herein by reference. This application also contains subject matter which is related to the subject matter of the following applications, each of which is assigned to the same assignee as this application and each of which is hereby incorporated herein by reference in its entirety:

"Cooling System and Method for a Multi-Component Electronics System Employing Conductive Heat Transport", Campbell et al., Ser. No. 11/539,905, filed Oct. 10, 2006;

"Method of Assembling a Cooling System for a Multi-Component Electronics System", Campbell et al., Ser. No. 11/539,907, filed Oct. 10, 2006;

"Liquid-Based Cooling System for Cooling a Multi-Component Electronics System", Campbell et al., Ser. No. 11/539,910, filed Oct. 10, 2006;

"Method and Apparatus for Mounting a Heat Sink in Thermal Contact with an Electronic Component", Colbert et al, Ser. No. 11/201,972, filed Aug. 11, 2005, and published Feb. 15, 2007, as U.S. Patent Publication No. US 2007/0035931 A1; and "Heatsink Apparatus for Applying a Specified Compressive Force to an Integrated Circuit Device", Colbert et al, Ser. No. 11/460,334, filed Jul. 27, 2006, and published Jan. 31, 2008, as U.S. Patent Publication No. 2008/0024991 A1.

TECHNICAL FIELD

The present invention relates in general to cooling an electronics system, and more particularly, to a hybrid cooling approach which facilitates air-cooling of secondary heat generating components of an electronics system using one or more thermally conductive auxiliary structures coupled to a thermally conductive coolant-carrying tube facilitating passage of liquid coolant through one or more cold plates coupled to one or more primary heat generating components of the electronics system to be cooled.

BACKGROUND OF THE INVENTION

The power dissipation of integrated circuit chips, and the modules containing the chips, continues to increase in order to achieve increases in processor performance. This trend poses a cooling challenge at both the module and system level. Increased air flow rates are needed to effectively cool high power modules and to limit the temperature of air exhausted into the computer center.

In many large server applications, processors along with their associated electronics (e.g., memory, disk drives, power, etc.) are packaged in removable drawer configurations stacked or aligned within a rack or frame. In other cases, the electronics may be in fixed locations within the rack or frame. Typically, the components are cooled by air moving in parallel air flow paths, usually front-to-back, impelled by one or more air moving devices (e.g., fans or blowers). In some cases it may be possible to handle increased power dissipation within a single drawer by providing greater air flow, for example, through the use of a more powerful air moving device or by increasing the rotational speed (i.e., RPM) of an existing air moving device. However, this approach is becoming unmanageable at the frame level in the context of a computer installation (e.g., data center).

The sensible heat load carried by the air exiting the frame will eventually exceed the ability of room air conditioning to effectively handle the load. This is especially true for large installations of "server farms" or large banks of computer frames close together. In such installations, not only will the room air conditioning be challenged, but the situation may also result in recirculation problems with some fraction of the "hot" air exiting one frame being drawn into the air inlet of the same or a nearby frame. Furthermore, while the acoustic noise level of a powerful (or higher RPM) air moving device in a single drawer may be within acceptable acoustic limits, because of the number of air moving devices in the frame, the total acoustic noise at the frame level may not be acceptable. In addition, the conventional openings in the frame for the entry and exit of air flow make it difficult, if not impossible to provide effective acoustic treatment to reduce the acoustic noise level outside the frame. Finally, as operating frequencies continue to increase, electromagnetic cross talk between tightly spaced computer frames is becoming a problem largely due to the presence of the openings in the covers.

SUMMARY OF THE INVENTION

The shortcomings of the prior art are overcome, and additional advantages are realized through the provision, in one aspect, of a hybrid cooling system for a multi-component electronics system. The hybrid cooling system includes an air moving device, a liquid-based cooling subsystem and a thermally conductive auxiliary structure. The air moving device establishes air flow across multiple components of the electronics system, which includes at least one primary heat generating component to be cooled and at least one secondary heat generating component to be cooled. The liquid-based cooling subsystem includes at least one cold plate configured to couple to the at least one primary heat generating component to be cooled for liquid-based cooling thereof. The liquid-based cooling subsystem further includes at least one thermally conductive coolant-carrying tube in fluid communication with the at least one cold plate for facilitating passage of liquid coolant therethrough. The thermally conductive auxiliary structure is coupled to the at least one thermally conductive coolant-carrying tube, and includes a plurality of thermally conductive fins extending from a surface thereof. When the hybrid cooling system is employed to cool the multi-component electronics system, the plurality of thermally conductive fins of the thermally conductive auxiliary structure are disposed at least partially over the at least one secondary heat generating component to be cooled, and provide cooling of at least a portion of the air flow established across the multiple components of the electronics system to further facilitate cooling thereof.

In another aspect, a cooled electronics system is provided which includes at least one electronics drawer containing multiple components, and a hybrid cooling system for cooling the multiple components. The electronics drawer includes at least one primary heat generating and at least one secondary heat generating component to be cooled. The hybrid cooling system includes an air moving device, a liquid-based cooling subsystem, and a thermally conductive auxiliary structure. The air moving device establishes air flow across the multiple components to be cooled. The liquid-based cooling subsystem includes at least one cold plate coupled to the at least one primary heat generating component to be cooled for liquid-based cooling thereof. The liquid-based cooling subsystem further includes at least one thermally conductive coolant-carrying tube in fluid communication with the at least one cold plate for facilitating passage of liquid coolant therethrough. The thermally conductive auxiliary structure is coupled to the at least one thermally conductive coolant-carrying tube, and includes a plurality of thermally conductive fins extending from a surface thereof. The plurality of thermally conductive fins are disposed at least partially over the at least one secondary heat generating component to be cooled, and provide cooling of at least a portion of the air flow established across the multiple components of the at least one electronics drawer to further facilitate cooling thereof.

In a further aspect, a method of fabricating a hybrid cooling system for a multi-component electronics system is provided. The method includes: providing an air moving device for establishing air flow across multiple components of an electronics system, which includes at least one primary heat generating component and at least one secondary heat generating component to be cooled; providing a liquid-based cooling subsystem comprising at least one cold plate configured to couple to the at least one primary heat generating component to be cooled for liquid-based cooling thereof, the liquid-based cooling subsystem further including at least one thermally conductive coolant-carrying tube in fluid communication with the at least one cold plate for facilitating passage of liquid coolant through the at least one cold plate; and coupling a thermally conductive auxiliary structure to the at least one thermally conductive coolant-carrying tube, the thermally conductive auxiliary structure including a plurality of thermally conductive fins extending from a surface thereof. When in use, with the hybrid cooling system coupled to the multi-component electronics system, the plurality of thermally conductive fins reside at least partially over the at least one secondary heat generating component to be cooled and provide cooling of at least a portion of the air flow established across the multiple components of the electronics system to further facilitate cooling thereof.

Further, additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIG. 5A is a more detailed partial cross-sectional plan view of the electronics drawer component layout of FIG. 3, and depicting fins of the thermally conductive auxiliary structure of the hybrid cooling system disposed to cool selected electronic components of the electronics drawer (and taken along line 5A-5A of FIG. 5B), in accordance with an aspect of the present invention;

FIG. 5B is a cross-sectional elevational view of the electronics drawer component layout and hybrid cooling system of FIG. 5A, taken along line 5B-5B, in accordance with an aspect of the present invention;

BEST MODE FOR CARRYING OUT THE INVENTION

As used herein "electronics system" comprises any system containing one or more heat generating components of a computer system or other electronics unit requiring cooling. The terms "electronics rack", "electronics frame", and "frame" are used interchangeably, and include any housing, rack, compartment, blade chassis, etc., having heat generating components of a computer system or electronics system and may be for example, a stand-alone computer processor having high, mid or low end processing capability. In one embodiment, an electronics frame comprises multiple electronics drawers, each having multiple heat generating components disposed therein requiring cooling. "Electronics drawer" refers to any sub-housing, blade, book, drawer, node, compartment, etc., having multiple heat generating electronics components disposed therein. Each electronics drawer of an electronics frame may be movable or fixed relative to the electronics frame, with rack mounted electronics drawers and blades of a blade center system being two examples of drawers of an electronics frame to be cooled.

"Electronic component" refers to any heat generating electronic component of, for example, a computer system or other electronics unit requiring cooling. By way of example, an electronic component may comprise one or more integrated circuit chips and/or other electronic devices to be cooled, including one or more processor modules, memory modules and memory support modules. As used herein, "primary heat generating component to be cooled" refers to a primary heat generating electronic component within the electronics system (with a processor module being one example), while "secondary heat generating component to be cooled" refers to a component of the electronics system generating less heat than the primary heat generating component to be cooled (with memory modules and memory support modules being examples of secondary heat generating components to be cooled).

Figure 1:
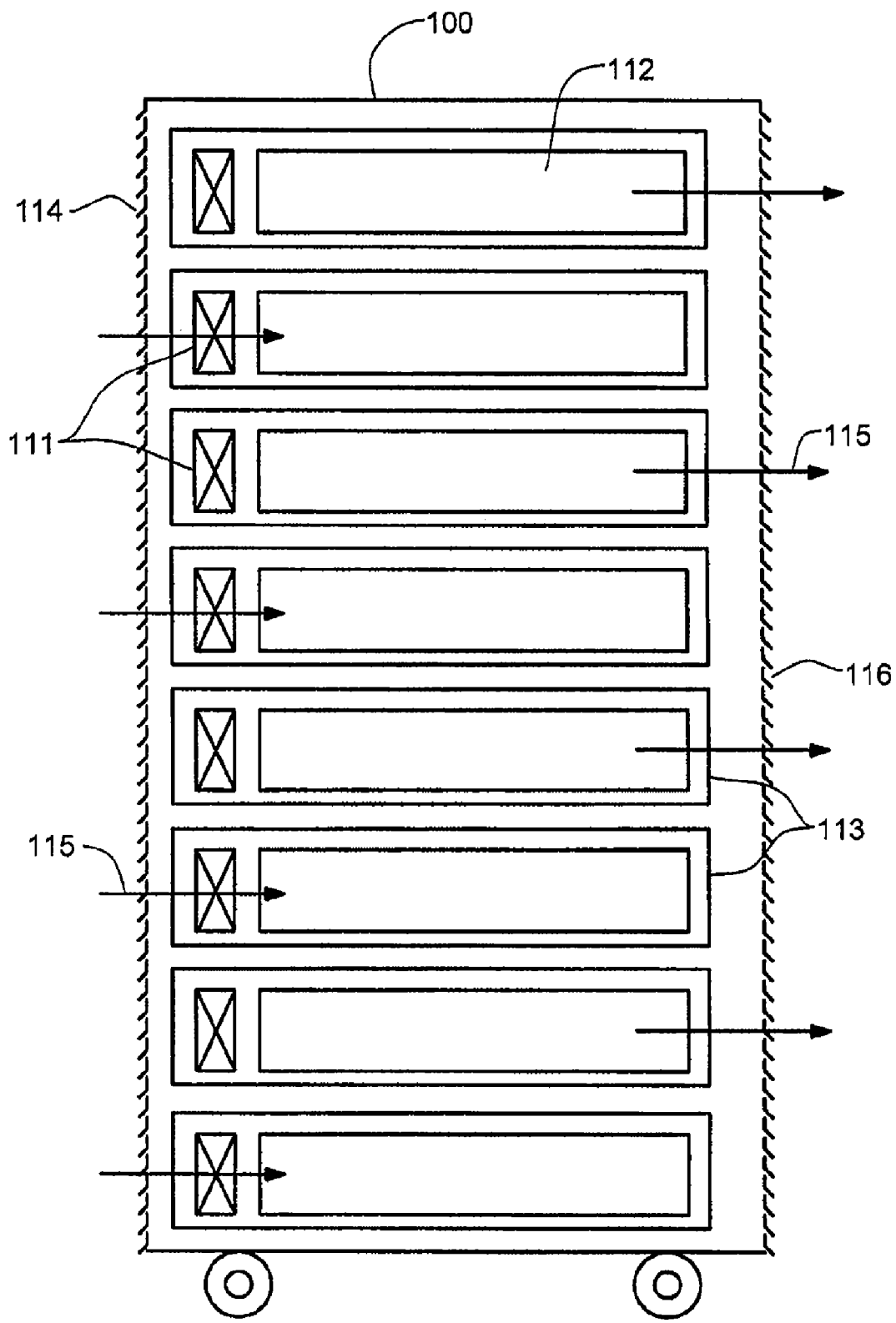
FIG. 1 depicts one embodiment of a conventional air-cooled electronics frame with heat generating electronic components disposed in removable electronics drawers.

As shown in FIG. 1, in rack-mounted configurations typical in the prior art, a plurality of air moving devices 111 (e.g., fans or blowers) provide forced air flow 115 needed to cool the electronic components 112 within the electronics drawers 113 of the frame 100. Cool air is taken in through a louvered inlet cover 114 in the front of the frame and exhausted out a louvered outlet cover 116 in the back of the frame.

Figure 2:
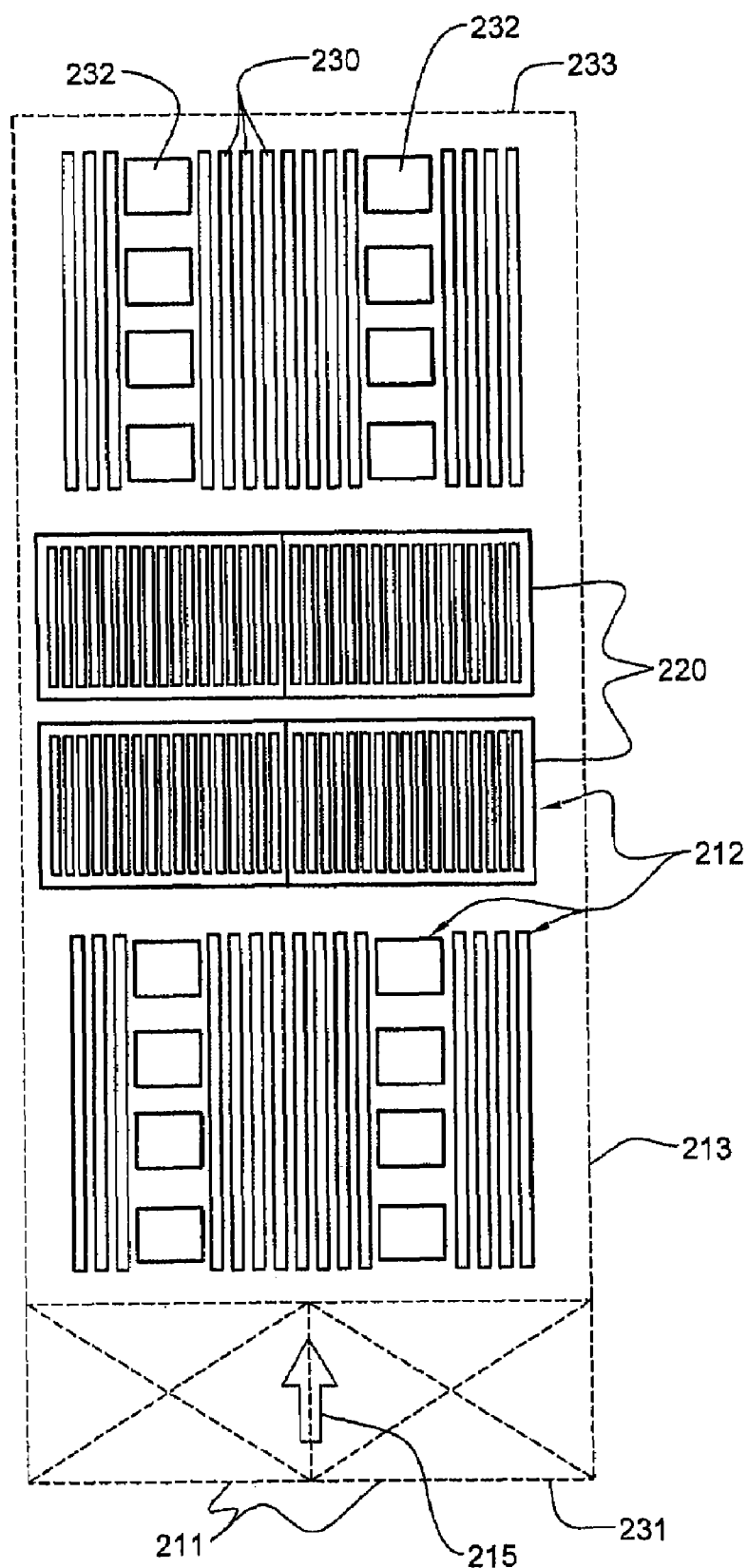
FIG. 2 is a plan view of one embodiment of an electronics drawer layout illustrating multiple electronic components to be cooled, in accordance with an aspect of the present invention.

FIG. 2 illustrates one embodiment of a multi-component electronics drawer 213 having a component layout in accordance with an aspect of the present invention. Electronics drawer 213 includes one or more air moving devices 211 (e.g., fans or blowers) which provide forced air flow 215 across the multiple electronic components 212 within electronics drawer 213. Cool air is taken in through a front 231 of electronics drawer 213 and exhausted out a back 233 of the electronics drawer. In this embodiment, the multiple electronic components to be cooled 212 include processor modules disposed below air-cooled heat sinks 220, as well as (by way of example) multiple rows of memory support modules 232 disposed between arrayed memory modules 230, such as air-cooled dual in-line memory module (DIMM) packages.

Those skilled in the art will note that although described herein in association with DIMM packages, and memory support modules, the concepts presented are applicable to facilitating cooling of any secondary heat generating component to be cooled within an electronics system. Again, the terms "primary heat generating component" and "secondary heat generating component" are used to differentiate between heat generating capabilities of components within the electronics system. By way of example, processor modules typically generate more heat than, for example, memory modules or memory support modules, and therefore are deemed primary heat generating components to be cooled within the electronics system, while the memory modules and memory support modules are referred to herein as secondary heat generating components to be cooled.

As illustrated further below, each DIMM package includes a short rectangular substrate plugged into a connector on a motherboard at the bottom of the electronics drawer, and projects upward from the motherboard. Memory chips are surface-mounted in a line on the DIMM substrate parallel to the air flow direction. A number of DIMMs are pluggable in closely spaced position across the electronics drawer, forming multiple air flow channels or passageways between the DIMMs which extend at least partially through the electronics drawer.

In order to provide greater performance, it will eventually be necessary to increase processor chip powers beyond the point where forced air-cooling is feasible as a solution. Because of their level of power dissipation, the memory support modules may also require the application of auxiliary cooling such as air-cooled, finned heat sinks to be effectively cooled. To meet these increased cooling demands, a hybrid cooling system with a liquid-based cooling subassembly including at least one liquid-cooled cold plate physically coupled to the at least one primary heat generating component (e.g., processor module) to be cooled may be provided.

Figure 3:
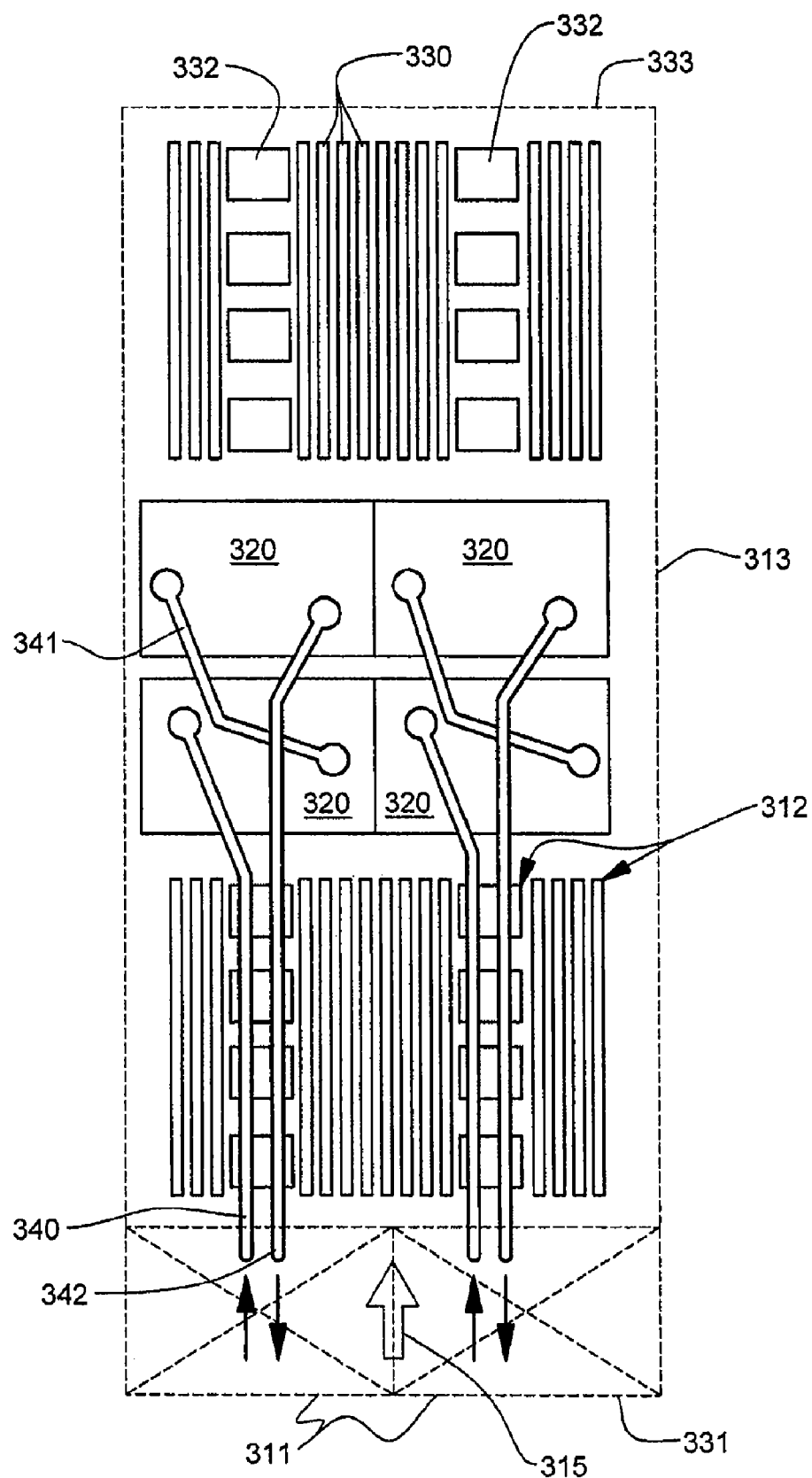
FIG. 3 is a plan view of the electronics drawer layout of FIG. 2 illustrating one embodiment of an air and liquid cooling system for cooling the components of the drawer, in accordance with an aspect of the present invention.

FIG. 3 is a simplified depiction of the electronics drawer layout of FIG. 2, with a hybrid cooling system shown, including a liquid-based cooling subsystem with multiple sets of thermally conductive coolant-carrying tubes, in accordance with an aspect of the present invention.

More particularly, FIG. 3 depicts one embodiment of an electronics drawer 313 component layout wherein one or more air moving devices 311 provide forced air flow 315 to cool multiple components 312 within electronics drawer 313. Cool air is taken in through a front 331 of the drawer and exhausted out a back 333 of the drawer. The multiple components to be cooled include multiple processor modules to which liquid-cooled cold plates 320 are coupled, as well as multiple arrays of memory modules 330 (e.g., dual in-line memory modules (DIMMs)) and multiple rows of memory support modules 332 (e.g., DIMM control modules). In the embodiment illustrated, memory modules 330 and memory support modules 332 are partially arrayed near front 331 of electronics drawer 313, and partially arrayed near back 333 of electronics drawer 313. In one embodiment, memory modules 330 are dual in-line memory module packages configured as described above in connection with memory modules 230 of FIG. 2. In the embodiment of FIG. 3, memory modules 330 and memory support modules 332 are cooled by air flow 315 across the electronics drawer.

The thermally conductive coolant-carrying tubes in the embodiment of FIG. 3 comprise sets of coolant-carrying tubes, with each set including a thermally conductive coolant supply tube 340 and a thermally conductive coolant return tube 342. In this example, each set of tubes provides liquid coolant to a pair of cold plates 320 (coupled to a pair of processor modules). Coolant flows into a first cold plate of the pair via the thermally conductive coolant supply tube 340 and from the first cold plate to the second cold plate via a bridge tube or line 341, which may or may not be thermally conductive. From the second cold plate of the pair, coolant is returned through the respective thermally conductive coolant return tube 342. In an alternate embodiment, only the supply tube 340 or the return tube 342 is thermally conductive (e.g., fabricated of a metal such as copper or aluminum tube), with the other tube being, for example, a flexible, non-thermally conductive coolant-carrying line or hose. The auxiliary structures presented herein below employ at least one thermally conductive coolant-carrying tube in fluid communication with at least one liquid-cooled cold plate coupled to at least one primary heat generating component to be cooled.

In anticipation that power dissipation of memory modules (and memory support modules) will also increase in the future, an enhanced hybrid cooling system and method of fabrication are presented herein with reference to FIGS. 4A-7. The hybrid cooling systems and methods presented provide enhanced cooling of, for example, the memory modules and the memory support modules beyond conventional air cooling.

One approach to accommodating greater power dissipation from the DIMMs would be to utilize water-cooled cold plates attached to the DIMMs in a manner similar to that employed for the processor modules. Unfortunately, because of the above-noted DIMM geometry and close spacing, this approach is not practical. Thus, provided herein is an enhanced hybrid cooling system and method which utilize a thermally conductive auxiliary structure extending outward over the DIMMs and coupled to one or more of the thermally conductive coolant-carrying tubes (facilitating passage of coolant to the cold plates attached to the processor modules). As used herein, the phrases "coupled" and "physically coupled" refer to either a direct or indirect physical coupling, for example, of the auxiliary structure to at least one thermally conductive coolant-carrying tube.

A plurality of thermally conductive fins extend from a surface from the thermally conductive auxiliary structure into flow passages defined between adjacent DIMMs to extract heat from air passing over the DIMMs. In another embodiment, the plurality of thermally conductive fins interdigitate in spaced relation with a plurality of upward projecting fins of one or more air-cooled heat sink(s) coupled to one or more of the memory support modules. In either embodiment, heat extracted from air is transported via the thermally conductive fins to the thermally conductive auxiliary structure and hence to the thermally conductive coolant-carrying tube(s) where it is rejected by convection to the coolant flowing through the lines.

Figure 4A:
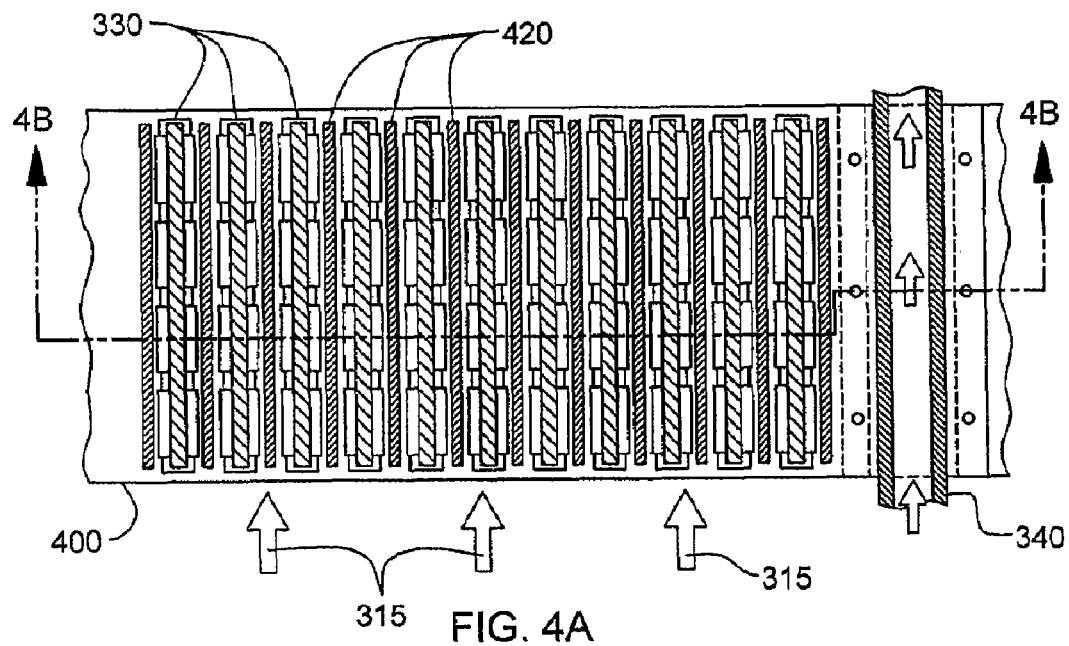
FIG. 4A is a partial cross-sectional plan view of the electronics drawer component layout of FIG. 3, and depicting fins of a thermally conductive auxiliary structure of a hybrid cooling system disposed to cool selected electronic components of the electronics drawer (and taken along line 4A-4A of FIG. 4B), in accordance with an aspect of the present invention.
Figure 4B:
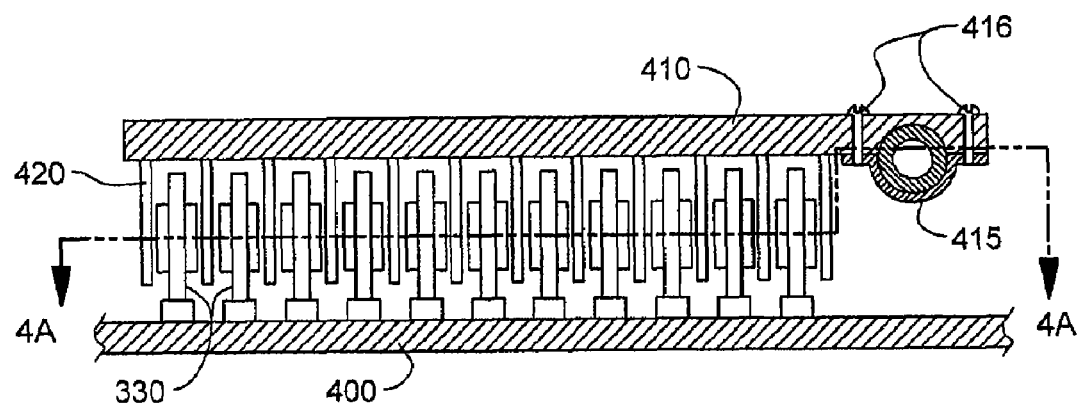
FIG. 4B is a cross-sectional elevational view of the partial electronics drawer component layout and hybrid cooling system of FIG. 4A, taken along line 4B-4B, in accordance with an aspect of the present invention.

Building on the hybrid air and liquid cooling approach of FIG. 3, FIGS. 4A & 4B depict plan and elevational cross-sectional views of a portion of an electronics drawer and enhanced hybrid cooling system, in accordance with an aspect of the present invention. In this embodiment, a plurality of DIMM packages (or memory modules 330) again plug into and extend upward from a supporting substrate 400. The DIMM packages are spaced with air flow 315 passing between the DIMM packages for cooling thereof. Additionally, the hybrid cooling system includes a thermally conductive auxiliary structure 410 which, in this embodiment, includes a metal plate configured to accommodate and physically couple to one or more of the thermally conductive coolant-carrying tubes. In the embodiment of FIGS. 4A & 4B, thermally conductive auxiliary structure 410 is configured to accommodate a thermally conductive coolant supply tube 340. A mounting bracket 415 removably secures thermally conductive auxiliary structure 410 to thermally conductive coolant supply tube 340 employing, for example, multiple connectors 416 (such as threaded bolts). A plurality of thermally conductive fins 420 extend downward (in this embodiment) from thermally conductive auxiliary structure 410 into the air flow passages defined between adjacent DIMM packages.

As heat is removed from the DIMM packages through forced convection into the flowing air, thermally conductive fins 420 between adjacent DIMM packages effectively reduce the hydraulic diameter of the flow passages, and for heat transfer in the laminar flow regime, the convective heat transfer coefficient is inversely proportional to the hydraulic diameter of the flow passage. Thus, the presence of the plurality of thermally conductive fins 420 in the flow passages defined between the memory modules results in an increase in the rate of heat transfer to the air by the DIMMs. As air flows through the passages defined between the DIMMs, the air absorbs heat and rises in temperature. This rise in air temperature along the air passages has the effect of increasing the temperature of the DIMMs further along the flow paths. However, the plurality of thermally conductive fins 420 function to mitigate this effect. As air heats along the flow passages, a portion of the heat absorbed by the air is transferred to the cooler thermally conductive fins, thereby reducing the temperature rise in the air along the passages. The heat transferred to the thermally conductive fins is conducted into the thermally conductive base plate, and hence to one or more thermally conductive coolant-carrying tubes, where it passes by convection to the liquid coolant flowing within the tube(s).

Although the thermally conductive auxiliary structure 410 is illustrated in FIGS. 4A & 4B as including a solid thermally conductive plate (e.g., fabricated of copper or aluminum), it will be understood by those skilled in the art that the base plate could alternatively incorporate structures such as heat tubes or vapor chambers to further enhance its heat transport capability.

FIGS. 5A & 5B depict a more detailed embodiment of the secondary heat generating components of an electronics drawer to be cooled employing a hybrid cooling system, in accordance with an aspect of the present invention. The electronics drawer component layout is again assumed to be similar to that depicted in FIGS. 3, 4A & 4B and described above. As shown in FIGS. 5A & 5B, a plurality of memory modules 330 (such as DIMM packages) are arrayed across the electronics drawer (such as depicted in FIG. 3). The DIMM modules plug into connectors coupled to substrate 400. Similarly, a plurality of memory support modules 332 are aligned in rows and also plug into substrate 400. In this embodiment, a removable, thermally conductive auxiliary structure 510 is disposed over the array of memory modules 330 and rows of memory support modules 332. The sets of thermally conductive coolant-carrying tubes 340, 342 are disposed to extend over the rows of memory support modules 332 as shown. The thermally conductive auxiliary structure is configured to accommodate the multiple coolant-carrying tubes and is physically coupled to the tubes employing multiple mounting plates 515 and connectors 516. The thermally conductive auxiliary structure 510 again includes a plurality of thermally conductive fins 520 (projecting from a surface of the base plate). Fins 520 extend into the air passageways defined between adjacent memory modules 330 in a manner such as described above in connection with FIGS. 4A & 4B. In this embodiment, air-cooled fin heat sinks 530 are coupled to the memory support modules 332 and have fins extending in close proximity to mounting plates 515, and hence, in close proximity to thermally conductive coolant-carrying tubes 340, 342.

The thermally conductive auxiliary structures of the embodiments of FIGS. 4A-5B can be attached via mounting plates joined to the underside of the coolant distribution line(s) by means of, for example, a thermally conductive epoxy, solder or braze around the lower half of the coolant-carrying tube(s). The mounting plates extend outwards from the tubes to provide increased thermal contact area with the underside of the thermally conductive auxiliary structure, thereby reducing thermal contact resistance between the auxiliary structure(s) and the tube(s). In one embodiment, the auxiliary structure and mounting plates are joined via threaded mechanical screws.

It should be noted that it is sometimes necessary to replace or add DIMMs to a node in the field. Thus, one feature of the hybrid cooling system described herein is that it allows servicing in the field. This is accomplished by withdrawing the node (i.e., electronics drawer) from the electronics rack and removing the attachment screws from the thermally conductive auxiliary structure. The auxiliary structure may then be lifted and removed to allow access to unplug or plug DIMMs into the drawer's motherboard. As another feature of the hybrid cooling system disclosed herein, the system not only enhances the cooling of the secondary heat generating components (e.g., DIMM packages), it reduces the heat load on the customer room air conditioning by further reducing heat that is transferred to the air exiting each drawer of the electronics frame.

Figure 6:
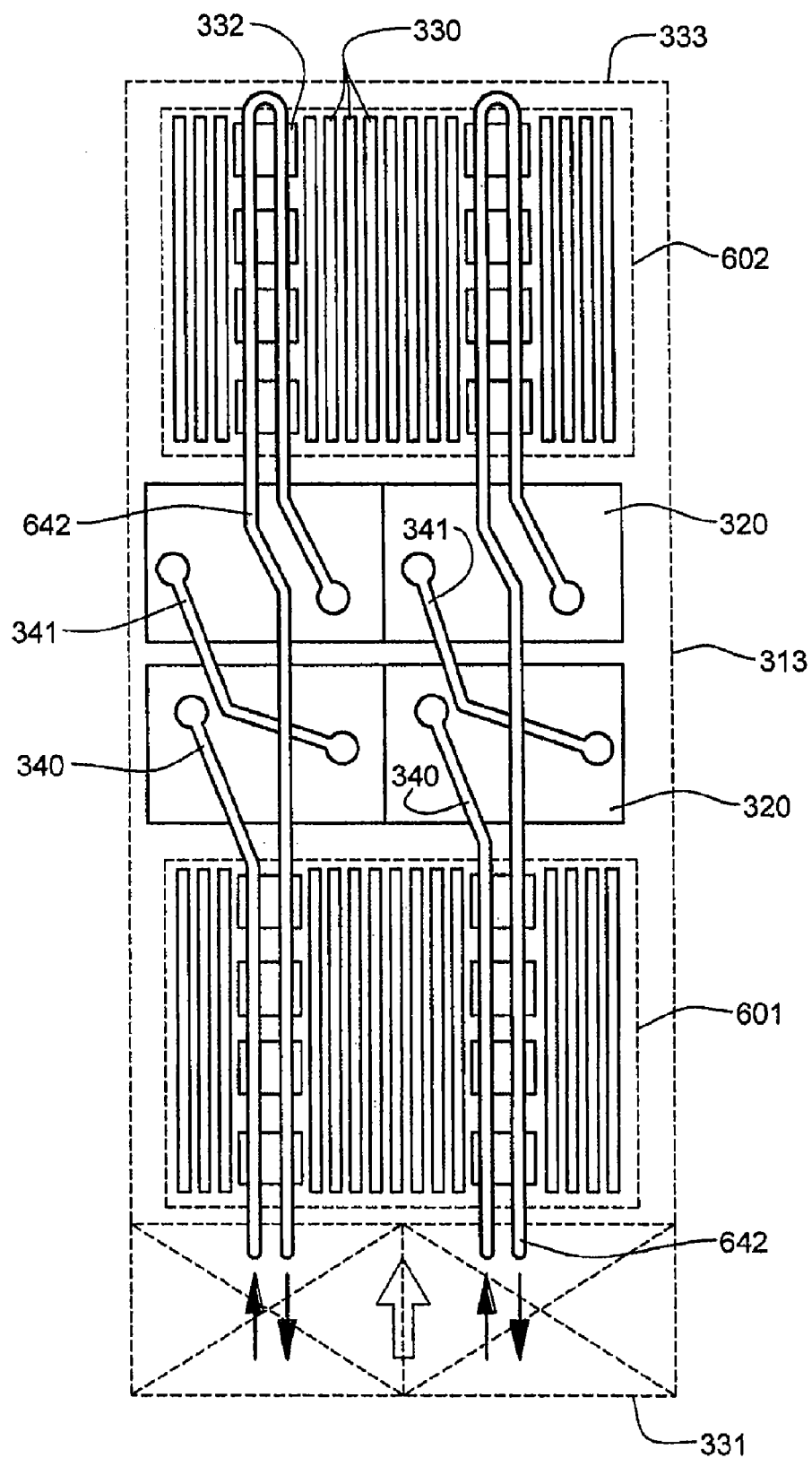
FIG. 6 is a plan view of the electronics drawer component layout of FIG. 3, showing an alternate embodiment for the thermally conductive coolant-carrying tubes of the hybrid cooling system, in accordance with an aspect of the present invention.

FIG. 6 depicts an alternate layout for the thermally conductive coolant return lines of the liquid-based cooling subsystem described above. As shown, the memory modules 330 (e.g., DIMM packages) are arrayed 601 at a front 331 and arrayed 602 at a back 333 of the multi-component electronics drawer 313. Between the arrayed memory modules are rows of memory support modules 332. The thermally conductive coolant-carrying tubes include two sets of liquid distribution lines, with each set having a thermally conductive coolant supply tube 340 providing liquid coolant to a first cold plate 320 (coupled to a primary heat generating component to be cooled), a bridge distribution line 341 coupling the first cold plate to a second cold plate, and a thermally conductive coolant return tube 642 for return of the liquid coolant from the cold plates. In this embodiment, each coolant return tube 642 is extended in a U-shape to loop over memory support modules 332 aligned in a row in array 602 adjacent to the back 333 of the electronics drawer. Those skilled in the art should note that (as used herein) the terms "front" and "back" are relative and can be reversed, depending upon the implementation.

Figure 7:
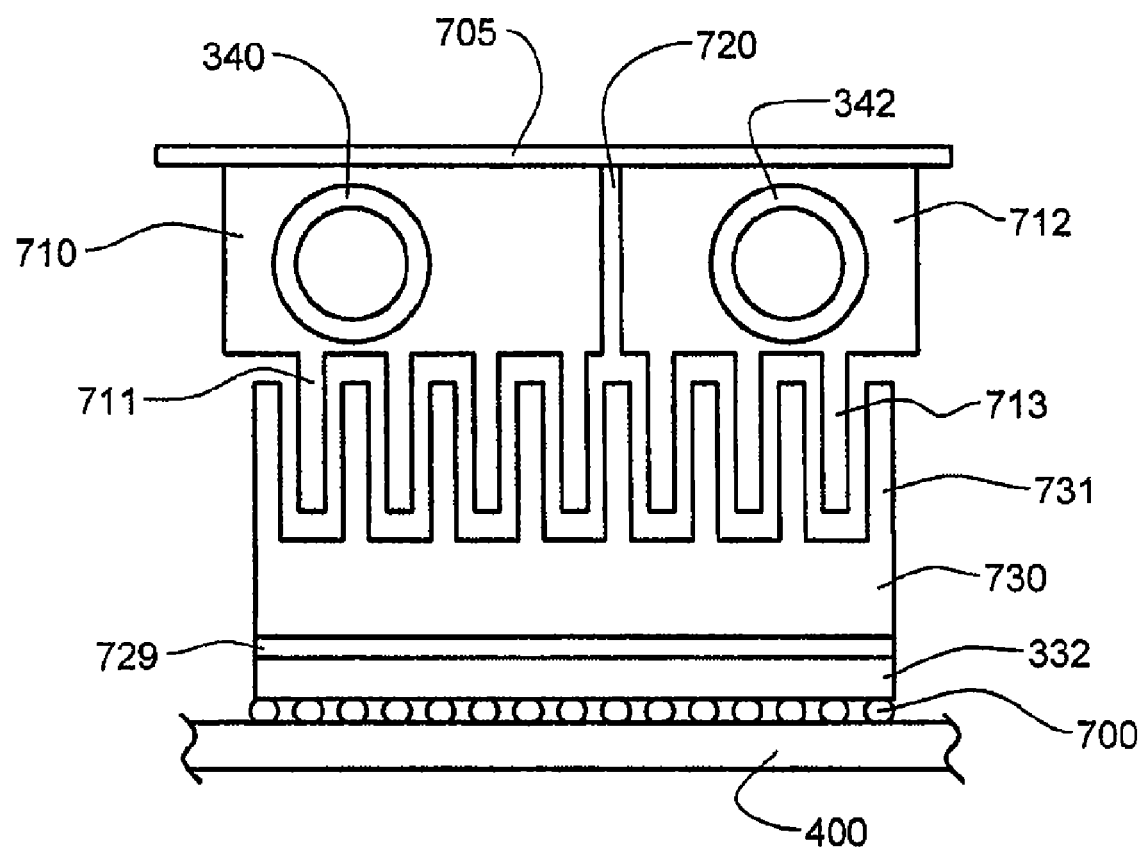
FIG. 7 is a partial elevational view of a secondary heat generating component of an electronics drawer to be cooled and showing a portion of a hybrid cooling system, wherein the secondary heat generating component has an air-cooled heat sink coupled thereto with the heat sink fins interdigitated with fins extending downward from the thermally conductive auxiliary structures coupled to the thermally conductive coolant-carrying tubes of the hybrid cooling system, in accordance with an aspect of the present invention.

As a further variation, FIG. 7 depicts a partial elevational view of a memory support module 332 coupled to substrate 400 via, for example, appropriate electrical interconnect 700. A thermal interface 729 (such as a thermal paste) couples an air-cooled heat sink 730 to memory support module 332. Air-cooled heat sink 730 includes a plurality of upwardly projecting thermally conductive fins 731. In this embodiment, the thermally conductive auxiliary structure comprises multiple block-shaped structures 710, 712 extending from a cover 705. Each block-shaped structure 710, 712 has an opening configured to accommodate a respective distribution line 340, 342. Since block-shaped structure 710 encircles, and is physically coupled to coolant supply tube 340, and block-shaped structure 712 encircles and is physically coupled to coolant return tube 342, an air space 720 is provided between the thermally conductive blocks to prevent direct conductive coupling between the thermally conductive coolant inlet and outlet distribution lines. Note that, in this example, it is assumed that cover 705 is fabricated of a non-thermally conductive material.

Extending from block-shaped structures 710, 712 are a plurality of thermally conductive fins 711, 713, respectively, which are sized and positioned to interdigitate in spaced opposing relation with the plurality of thermally conductive fins 731 extending from air-cooled heat sink 730. Although not fully shown, structures 710, 712 are each configured as a block of thermally conductive material (e.g., copper or aluminum) sized, for example, to extend substantially over air-cooled heat sink 730, which is itself sized to extend substantially completely over the respective memory support module 332 to be cooled.

Although preferred embodiments have been depicted and described in detail herein, it will be apparent to those skilled in the relevant art that various modifications, additions, substitutions and the like can be made without departing from the spirit of the invention, and that these are therefore considered to be within the scope of the invention as defined in the following claims.

What is claimed is:

1. A hybrid cooling system for a multi-component electronics system, the hybrid cooling system comprising:
   an air moving device for establishing air flow across multiple components of an electronics system, the electronics system comprising at least one primary heat generating component to be cooled and at least one secondary heat generating component to be cooled;
   a liquid-based cooling subsystem comprising at least one cold plate configured to couple to the at least one primary heat generating component to be cooled for liquid-based cooling thereof, the liquid-based cooling subsystem further comprising at least one thermally conductive coolant-carrying tube in fluid communication with the at least one cold plate for facilitating passage of liquid coolant through the at least one cold plate; and
   a thermally conductive auxiliary structure coupled to the at least one thermally conductive coolant-carrying tube, the thermally conductive auxiliary structure including a plurality of thermally conductive fins extending from a surface thereof, wherein when the hybrid cooling system is employed to cool the multi-component electronics system, with the at least one cold plate coupled to the at least one primary heat generating component to be cooled, the plurality of thermally conductive fins of the thermally conductive auxiliary structure are disposed at least partially over the at least one secondary heat generating component to be cooled, and provide cooling of at least a portion of the air flow established across the multiple components of the electronics system to further facilitate cooling thereof.

2. The hybrid cooling system of claim 1, wherein the thermally conductive auxiliary structure comprises a thermally conductive plate and the electronics system comprises multiple secondary heat generating components to be cooled, and wherein at least some thermally conductive fins of the plurality of thermally conductive fins extend from a surface of the thermally conductive plate into air flow passageways defined between at least some secondary heat generating components of the multiple secondary heat generating components when the hybrid cooling system is employed to cool the multi-component electronics system, the at least some thermally conductive fins functioning to cool air flow passing between the at least some secondary heat generating components.

3. The hybrid cooling system of claim 1, wherein the multiple secondary heat generating components comprise a plurality of memory modules arrayed on a substrate, and wherein the at least some thermally conductive fins extend into air flow passageways defined between adjacent memory modules arrayed on the substrate for cooling air flow passing between the adjacent memory modules when the hybrid cooling system is employed to cool the multi-component electronics system.

4. The hybrid cooling system of claim 1, wherein the thermally conductive auxiliary structure comprises a thermally conductive plate configured to matably engage the at least one thermally conductive coolant-carrying tube, and wherein the hybrid cooling system further comprises a mounting plate for removably coupling the thermally conductive plate to the at least one thermally conductive coolant-carrying tube.

5. The hybrid cooling system of claim 1, wherein the electronics system comprises multiple secondary heat generating components to be cooled, and wherein the hybrid cooling system further comprises at least one air-cooled heat sink configured to couple to at least one secondary heat generating component of the multiple secondary heat generating components to be cooled, and wherein the at least one thermally conductive coolant-carrying tube of the liquid-based cooling subsystem is disposed to extend over the at least one air-cooled heat sink coupled to the at least one secondary heat generating component when the hybrid cooling system is employed to cool the multi-component electronics system.

6. The hybrid cooling system of claim 5, wherein the at least one thermally conductive coolant-carrying tube comprises an extended tube section which loops outward from the at least one cold plate to over at least one secondary heat generating component to be cooled when the hybrid cooling system is employed to cool the multi-component electronics system.

7. The hybrid cooling system of claim 5, wherein the at least one primary heat generating component to be cooled comprises at least one processor module, and the multiple secondary heat generating components to be cooled comprise multiple memory modules and multiple memory support modules arrayed on a substrate, at least some memory support modules of the multiple memory support modules being aligned in at least one row, with the multiple memory modules being arrayed on at least one side thereof, and wherein when the hybrid cooling system is employed to cool the multi-component electronics system, the at least one thermally conductive coolant-carrying tube extends over the at least one row of memory support modules for facilitating cooling of air flow across the at least one row of memory support modules.

8. The hybrid cooling system of claim 5, wherein the electronics system resides in an electronics drawer of an electronics rack, the electronics drawer comprising a substrate, and wherein the multiple secondary heat generating components comprise multiple dual in-line memory modules and multiple memory support modules, the multiple dual in-line memory modules being arrayed at a first end and at a second end of the electronics drawer, with the at least one primary heat generating component to be cooled being disposed between dual in-line memory module arrays at the first and second ends, each primary heat generating component to be cooled comprising a processor module, and wherein when the hybrid cooling system is employed to cool the multi-component electronics system, the at least one cold plate is coupled to the at least one processor module to be cooled, and wherein the multiple memory support modules are aligned in multiple rows between the multiple dual in-line memory modules disposed at the first and second ends of the electronics drawer, and the at least one thermally conductive coolant-carrying tube is aligned to extend over at least one row of the rows of multiple memory support modules, and the thermally conductive auxiliary structure is coupled to the at least one thermally conductive coolant-carrying tube over the at least one row of memory support modules and extends outward therefrom over at least some of the multiple dual in-line memory modules, the plurality of thermally conductive fins extending from the surface of the thermally conductive auxiliary structure into air passageways defined between adjacent dual in-line memory modules arrayed on the substrate in part for cooling air flow passing between adjacent dual in-line memory modules.

9. The hybrid cooling system of claim 1, further comprising at least one air-cooled heat sink configured to couple to the at least one secondary heat generating component to be cooled, the at least one air-cooled heat sink comprising a plurality of thermally conductive fins extending therefrom, and wherein when the hybrid cooling system is employed to cool the multi-component electronics system, at least some thermally conductive fins of the plurality of thermally conductive fins extending from the surface of the thermally conductive auxiliary structure interdigitate in spaced, opposing relation with the plurality of thermally conductive fins extending from the at least one air-cooled heat sink coupled to the at least one secondary heat generating component to be cooled.

10. The hybrid cooling system of claim 9, wherein when the hybrid cooling system is employed to cool the multi-component electronics system, the at least one thermally conductive coolant-carrying tube is disposed over the at least one air-cooled heat sink coupled to the at least one secondary heat generating component to be cooled, and wherein the thermally conductive auxiliary structure comprises a block-shaped structure surrounding the at least one thermally conductive coolant-carrying tube, and aligned over and spaced from the at least one air-cooled heat sink coupled to the at least one secondary heat generating component to be cooled.

11. The hybrid cooling system of claim 10, wherein the liquid-based cooling subsystem further comprises multiple thermally conductive coolant-carrying tubes, the multiple thermally conductive coolant-carrying tubes comprising a thermally conductive coolant supply tube and a thermally conductive coolant return tube, and wherein the hybrid cooling system further comprises multiple thermally conductive auxiliary structures, each thermally conductive auxiliary structure being configured to couple to a respective thermally conductive coolant-carrying tube of the liquid-based cooling subsystem, and each thermally conductive auxiliary structure comprising a block-shaped structure aligned over and spaced from the at least one air-cooled heat sink coupled to the at least one secondary heat generating component to be cooled, and wherein thermally conductive auxiliary structures surrounding the thermally conductive coolant supply tube and the thermally conductive coolant return tube are spaced apart to prevent thermal conduction therebetween.

12. A cooled electronics system comprising:
at least one electronics drawer containing multiple components, the at least one electronics drawer comprising at least one primary heat generating component to be cooled and at least one secondary heat generating component to be cooled; and
a hybrid cooling system for cooling the multiple components of the at least one electronics drawer, the hybrid cooling system comprising:
an air moving device for establishing air flow across the multiple components of the at least one electronics drawer;
a liquid-based cooling subsystem comprising at least one cold plate coupled to the at least one primary heat generating component to be cooled for liquid-based cooling thereof, the liquid-based cooling subsystem further comprising at least one thermally conductive coolant-carrying tube in fluid communication with the at least one cold plate for facilitating passage of liquid coolant therethrough; and
a thermally conductive auxiliary structure coupled to the at least one thermally conductive coolant-carrying tube, the thermally conductive auxiliary structure including a plurality of thermally conductive fins extending from a surface thereof, the plurality of thermally conductive fins of the thermally conductive auxiliary structure being disposed at least partially over the at least one secondary heat generating component to be cooled, and providing cooling of at least a portion of the air flow established across the multiple components of the at least one electronics drawer to further facilitate cooling thereof.

13. The cooled electronics system of claim 12, wherein the thermally conductive auxiliary structure comprises a thermally conductive plate and the multiple components comprise multiple secondary heat generating components to be cooled, and wherein at least some thermally conductive fins of the plurality of thermally conductive fins extend from a surface of the thermally conductive plate into air flow passageways defined between at least some secondary heat generating components of the multiple secondary heat generating components to cool air flow passing between the at least some secondary heat generating components.

14. The cooled electronics system of claim 13, wherein the multiple secondary heat generating components comprise a plurality of memory modules arrayed on a substrate, and wherein the at least some thermally conductive fins of the plurality of thermally conductive fins extend into air flow passageways defined between adjacent memory modules arrayed on the substrate for cooling air flow passing between the adjacent memory modules.

15. The cooled electronics system of claim 12, wherein the thermally conductive auxiliary structure comprises a thermally conductive plate matably engaged with the at least one thermally conductive coolant-carrying tube, the hybrid cooling system further comprising a mounting plate removably coupling the thermally conductive plate to the at least one thermally conductive coolant-carrying tube.

16. The cooled electronics system of claim 12, wherein the electronics system comprises multiple secondary heat generating components to be cooled, and wherein the hybrid cooling system further comprises at least one air-cooled heat sink coupled to at least one secondary heat generating component of the multiple secondary heat generating components, and wherein the at least one thermally conductive coolant-carrying tube of the liquid-based cooling subsystem extends over the at least one air-cooled heat sink coupled to the at least one secondary heat generating component.

17. The cooled electronics system of claim 16, wherein the at least one primary heat generating component to be cooled comprises at least one processor module, and the multiple secondary heat generating components to be cooled comprise multiple memory modules and multiple memory support modules arrayed on a substrate, at least some memory support modules of the multiple memory support modules being aligned in at least one row, with the multiple memory modules being arrayed on at least one side thereof, the at least one thermally conductive coolant-carrying tube extending over the at least one row of memory support modules for facilitating cooling of air flow across the at least one row of memory support modules.

18. The cooled electronics system of claim 12, further comprising at least one air-cooled heat sink coupled to the at least one secondary heat generating component to be cooled, the at least one air-cooled heat sink comprising a plurality of thermally conductive fins extending therefrom, and wherein at least some thermally conductive fins of the plurality of thermally conductive fins extending from the surface of the thermally conductive auxiliary structure interdigitate in spaced, opposing relation with the plurality of thermally conductive fins extending from the at least one air-cooled heat sink coupled to the at least one secondary heat generating component to be cooled.

19. The cooled electronics system of claim 18, wherein the at least one thermally conductive coolant-carrying tube extends over the at least one air-cooled heat sink coupled to the at least one secondary heat generating component to be cooled, and wherein the thermally conductive auxiliary structure comprises a block-shaped structure surrounding the at least one thermally conductive coolant-carrying tube, and aligned over and spaced from the at least one air-cooled heat sink coupled to the at least one secondary heat generating component to be cooled.

* * * * *